US008659473B2

(12) United States Patent
Bauwelinck et al.

(10) Patent No.: US 8,659,473 B2
(45) Date of Patent: Feb. 25, 2014

(54) AMPLIFIER CIRCUIT FOR A RANGING TRANSCEIVER

(75) Inventors: Johan Bauwelinck, Temse (BE); Zhisheng Li, Ghent (BE); Guy Torfs, Ghent (BE); Jan Vandewege, Mairakerke-Gent (BE); Xin Yin, Ghent (BE)

(73) Assignees: IMEC, Leuven (BE); Universiteit Gent, Ghent (BE); ESSENSIUM, Leuven (BE)

( * ) Notice: Subject to any disclaimer, the term of this patent is extended or adjusted under 35 U.S.C. 154(b) by 373 days.

(21) Appl. No.: 13/231,091

(22) Filed: Sep. 13, 2011

(65) Prior Publication Data

US 2012/0064836 A1 Mar. 15, 2012

Related U.S. Application Data

(60) Provisional application No. 61/382,379, filed on Sep. 13, 2010.

(30) Foreign Application Priority Data

Jan. 21, 2011 (EP) ..................................... 11151672

(51) Int. Cl.
*G01S 7/32* (2006.01)
*G01S 7/03* (2006.01)

(52) U.S. Cl.
CPC ...................................... *G01S 7/032* (2013.01)
USPC ............................ 342/148; 342/159; 342/175

(58) Field of Classification Search
CPC ... G01S 13/931; G01S 7/032; G01S 13/5244; H04B 5/02
USPC .................................. 342/118, 148, 159, 175
See application file for complete search history.

(56) References Cited

U.S. PATENT DOCUMENTS 5,874,840 A    2/1999   Bonaccio
5,880,637 A  * 3/1999   Gonzalez ...................... 330/253

(Continued)

FOREIGN PATENT DOCUMENTS

EP       1833162        12/2007
WO    WO2007/034222      3/2007

(Continued)

OTHER PUBLICATIONS

Mazzanti, Andrea et al., "Analysis of Reliability and Power Efficiency in Cascode Class-E PAs", IEEE Journal of Solid-State Circuits, vol. 41, No. 5, May 2006, pp. 1222-1229.

(Continued)

*Primary Examiner* — John B Sotomayor
(74) *Attorney, Agent, or Firm* — McDonnell Boehnen Hulbert & Berghoff LLP

(57) ABSTRACT

An amplifier circuit is disclosed. In one embodiment, the amplifier circuit includes an input configured to receive an input signal. The amplifier circuit further includes an amplifier connected to the input that is configured to receive the input signal and generate a modulated input signal based on the input signal and one of a first amplification level and a second amplification level. The amplifier comprises a first transistor configured to receive the input signal and a second transistor connected in cascode with the first transistor. The amplifier circuit further includes a switching component configured to switch the amplifier between the first amplification level and the second amplification level. The amplifier circuit still further includes an output connected to the amplifier and configured to output the modulated input signal.

20 Claims, 8 Drawing Sheets

(56) References Cited

U.S. PATENT DOCUMENTS

| | | | |
|---|---|---|---|
| 5,907,262 A * | 5/1999 | Graeme et al. | 330/255 |
| 5,942,946 A * | 8/1999 | Su et al. | 330/310 |
| 6,052,027 A * | 4/2000 | Candy | 330/260 |
| 6,150,883 A * | 11/2000 | Ivanov | 330/253 |
| 6,154,092 A * | 11/2000 | Lee et al. | 330/51 |
| 6,208,208 B1 * | 3/2001 | Komatsu et al. | 330/255 |
| 2004/0189388 A1 * | 9/2004 | Nguyen et al. | 330/254 |
| 2005/0077965 A1 | 4/2005 | Li | |
| 2005/0212604 A1 * | 9/2005 | Cyr et al. | 331/16 |
| 2006/0119435 A1 | 6/2006 | Oh et al. | |
| 2006/0125562 A1 * | 6/2006 | Sowlati | 330/252 |
| 2006/0229046 A1 * | 10/2006 | Bult et al. | 455/252.1 |
| 2007/0207746 A1 | 9/2007 | Huang et al. | |
| 2008/0036536 A1 * | 2/2008 | Khorramabadi | 330/252 |
| 2010/0329234 A1 * | 12/2010 | Akbari | 370/347 |

FOREIGN PATENT DOCUMENTS

| WO | WO2007/071748 | 6/2007 |
|---|---|---|
| WO | WO2008/145604 A1 | 12/2008 |

OTHER PUBLICATIONS

Apostolidou, Melina et al., "A 65 nm CMOS 30 dBm Class-E RF Power Amplifier With 60% PAE and 40% PAE at 16 dB Back-Off", IEEE Journal of Solid-State Circuits, vol. 44, No. 5, May 2009, pp. 1372-1379.

Sira, Daniel et al., "Output Power Control in Class-E Power Amplifiers", IEEE Microwave and Wireless Components Letters, vol. 20, No. 4, Apr. 2010, pp. 232-234.

Tsai, King-Chun, et al., "A 1.9-GHz, 1-W CMOS Class-E Power Amplifier for Wireless Communications", IEEE Journal of Solid-State Circuits, vol. 34, No. 7, Jul. 1999, pp. 962-970.

Tubbax, Huub et al., "A Novel Positioning Technique for the 2.4GHz ISM Band", Proceedings of the 6th Workshop on Positioning, Navigation and Communication 2009, (WPNC '09), San Diego, CA, USA, pp. 145-150.

Yin, X. et al., "Embedded Ranging System in ISM Band", Electronics Letters, vol. 44, No. 17, Aug. 14, 2008, 2 pages.

Yoo, Changsik et al., "A Common-Gate Switched 0.9-W Class-E Power Amplifier With 41% PAE in 0.25-um CMOS", IEEE Journal of Solid-State Circuits, vol. 36, No. 5, May 2001, pp. 823-830.

Song, Yonghoon et al., "A CMOS Class-E Power Amplifier With Voltage Stress Relief and Enhanced Efficiency", IEEE Transactions on Microwave Theory and Techniques, vol. 58, No. 2, Feb. 2010, pp. 310-317.

D'Amico, Stefano et al., "A 4.1-mW 10-MHz Fourth-Order Source-Follower-Based Continuous-Time Filter With 79-dB DR", IEEE Journal of Solid-State Circuits, vol. 41, No. 12, Dec. 2006, pp. 2713-2719.

European Search Report, European Patent Application No. 11151672.0 dated May 24, 2011.

Chen, Yong et al., "Source-Follower-Based Bi-quad Cell for Continuous-Time Zero-Pole Type Filters", IEEE, 2010, pp. 3629-3632.

* cited by examiner

AMPLIFIER CIRCUIT FOR A RANGING TRANSCEIVER

CROSS-REFERENCE TO RELATED APPLICATIONS

This application is a non-provisional of U.S. Provisional Patent Application Ser. No. 61/382,379 filed Sep. 13, 2010, the contents of which are hereby incorporated by reference. Further, this application claims priority to European Patent Application Serial No. EP 11151672.0 filed Jan. 21, 2011, the contents of each of which are hereby incorporated by reference.

BACKGROUND

Ranging is the process of determining the distance from one location or position to another location or position. For indoor ranging with submeter accuracy, it is often desirable to use wideband signals. This is because wideband signals may avoid multipath interference, which disturbs the time of arrival measurement. A comparison of multipath interference in wideband and narrowband signals is illustrated in FIG. 1.

An example of a typical ranging system may be that described in WO2007/071748. The proposed indoor ranging system combines the advantages of both broadband and narrowband signals to achieve a high ranging accuracy in presence of strong multipath reflections, to realize a good link budget, and to be compliant with the spectral regulations. The fundamental idea is that relatively narrowband radios, such as those used in wireless local area network (WLAN) products, may exhibit and/or can be stimulated to exhibit wideband transient signals at the beginning of the packet.

One possible way to realize a fast enabling of the packet is to use a radio frequency (RF) switch, such as that proposed in "*Embedded ranging system in ISM Band*" (X. Yin et al., Electronics Letters, Vol. 44, No. 17, pp. 1043-1045, August 2008), or that proposed in "*A Novel Positioning Technique for 2.4 GHz ISM Band*", (H. Tubbax, Proc. 4th IEEE Radio and Wireless Symposium, San Diego, USA, January 2009). The wideband transient signals can then be leveraged for improved positioning accuracy at the receiver. In particular, these wideband transient signals can be processed along with the narrowband communication signal. The system uses the same frequency band for both communication and ranging purposes, so that no separate dedicated ranging transceiver is needed. However, in order to achieve low cost and low power consumption, an integrated ranging transceiver is needed.

Power amplifier circuits for ranging applications are often designed employing cascoded transistors. The advantages of a cascode topology have been analysed in detail in the literature (see, for example, "*A Common-Gate Switched 0.9-W Class-E Power Amplifier with 41% PAE in 0.25 μm CMOS*" (C. Yoo et al., IEEE J. Solid-state Circuits, vol. 36, no. 5, pp. 823-830, May 2001) and "*Analysis of Reliability and Power Efficiency in Cascode Class-E PAs*" (Mazzanti et al., IEEE J. of Solid-state Circuits, vol. 41, no. 5, pp. 1222-1229, May 2006)). In a non-cascode topology, the maximum drain voltage can be, for example, 3.56 times the supply voltage, and the drain-source breakdown voltage is only 2 to 3 times the typical supply voltage for complementary metal-oxide-semiconductor (CMOS). When a cascode topology is used, on the other hand, the circuit can sustain two times the breakdown voltage of a single transistor, which thus can allow a maximum supply voltage that is almost two times higher. The same output power can be obtained with lower load resistance $R_L$, but the lower $R_L$ gives rise to more power loss in the power amplifier, which degrades the efficiency.

Often a CMOS power amplifier is implemented as a class-E power amplifier. The class-E topology makes it possible to reuse the parasitic drain-source capacitance of the switching transistor. A class-E power amplifier circuit is typically used in a switching design for applications where power efficiency is a major issue and where such high frequencies are involved that the switching time becomes comparable to the duty time. Its operation is based on the portion of the input signal cycle during which the amplifying device conducts.

Accordingly, a differential topology is thereby adopted. The differential topology can provide a two times higher output power than the single-ended one. For the same output power, the load resistance of a differential Class-E power amplifier (PA) can be two times higher than that of a single ended one, which thus can have higher efficiency. The topology of the differential cascode Class-E PA is shown in FIG. 2.

Since a ranging Class-E power amplifier requires a very fast switch-on and switch-off speed for performing time-based ranging, a switching function should be added to the circuit. In "*A 1.9-GHz, 1-W CMOS Class-E Power Amplifier for Wireless Communications*" (Tsai and Gray, IEEE J. Solid-state Circuits, vol. 34, no. 7, pp. 962-970, July 1999), a common-source switch is applied at the common-source node of the input transistors. This is illustrated in FIG. 3. While no speed of the switch is mentioned in Tsai et al., because the common-source switch is on the signal path, which has a finite switch-on resistance, the common-source switch inevitably degrades the drain efficiency of the power amplifier. In order to minimize the effect of the common-source switch, the size of the switch has to be very large, thereby consuming a large area and, in turn, lowering efficiency.

In order to control the output power for the class-E power amplifier, the supply voltage may be tuned. Alternately, when transformers are used to combine the output power of several power amplifiers, the power control can be implemented by switching on and off certain power amplifiers. Other solutions may involve controlling the power by tuning the effective load resistance with varactors with high quality factor or by changing the size of the input transistor. Such techniques, however, typically offer a very limited power control range and low efficiency in low output power levels.

In "*Output Power Control in Class-E Power Amplifiers*" (Sira et al., IEEE Microwave and Wireless Components Let., vol. 20, no. 4, pp. 232-234, April 2010), the power control is implemented with dynamic cascode bias, since a cascode topology is used. In "*A 65 nm CMOS 30 dBm Class-E RF Power Amplifier With 60% PAE and 40% PAE at 16 dB Back-Off,*" (M. Apostolidou et al., IEEE J. of Solid-state Circuits, vol. 44, no. 5, May 2009), the power control is implemented with a dynamic supply voltage together with the dynamic self-bias voltage of the self-bias topology. However, with only dynamic drain supply, and with only dynamic cascode bias, the class-E PA cannot provide the optimal drain efficiency in low output power levels.

For the cascode Class-E topology, it has been suggested to control the output power with the dynamic supply voltage. The cascode bias $V_{CG}$ may be direct current (DC) fixed or connected to $V_{DD}$. However, the optimal cascode bias shifts with the adjusting of $V_{DD}$. The lower $V_{CG}$ is needed for the optimal drain efficiency when $V_{DD}$ is lower. Hence, dynamic cascode bias is needed to optimize the output power and efficiency for different $V_{DD}$ values. Implementing the power control by adjusting the cascode bias $V_{CG}$ is not a satisfactory solution either, as it also cannot provide the optimal efficiency in low output power levels.

SUMMARY

An object of the present disclosure is to provide a power amplifier circuit for use in a ranging application that overcomes the above-mentioned drawbacks of the prior art solutions.

In one aspect, an amplifier circuit is disclosed. The amplifier circuit comprises an input configured to receive an input signal. The amplifier circuit further comprises an amplifier connected to the input and configured to receive the input signal and generate a modulated input signal based on the input signal and one of a first amplification level and a second amplification level. The amplifier comprises a first transistor configured to receive the input signal, where the first transistor comprises a first gate, and a second transistor connected in cascode with the first transistor, wherein the second transistor comprises a second gate. The amplifier circuit further comprises a switching component configured to switch the amplifier between the first amplification level and the second amplification level. The switching component is switchably connected between (i) the second gate and (ii) a first port configured to receive a first reference voltage and a second port configured to receive a second reference voltage different than the first reference voltage. The amplifier circuit further includes an output connected to the amplifier and configured to output the modulated input signal.

In another aspect, a transmitter is disclosed including the amplifier circuit described above.

In yet another aspect, a transceiver is disclosed including the transmitter described above.

In still another aspect, a differential amplifier circuit is disclosed. The differential amplifier circuit includes a first driver stage comprising a first inverter, a second inverter, and a resistive feedback. The differential amplifier circuit further includes a second driver stage connected to the first driver stage comprising a first differential amplifier. The differential amplifier circuit still further includes an output stage connected to the second driver stage comprising a second differential amplifier. The differential amplifier circuit still further includes a first switch connected to the output stage, a second switch connected to the second driver stage, and a resistive divider connected to the first switch.

BRIEF DESCRIPTION OF THE DRAWINGS

A number of example embodiments are described below in conjunction with the appended drawing figures, wherein like reference numerals refer to like elements in the various figures.

DETAILED DESCRIPTION

The disclosure presents a power amplifier circuit that can be used in, for example, a ranging application. The present disclosure also relates to a low cost, low power integrated transceiver arranged for accurate indoor ranging.

Ranging may be used, for example, to estimate the distance between a transmitter and one or more receivers. To this end, the transceiver may comprise a transmitter and a receiver.

The transmitter may comprise a power amplifier, such as the power amplifier circuit disclosed herein. The disclosed power amplifier may employ a switching control block to allow for fast (e.g., on the order of nanoseconds) switching of the packet envelope. The disclosed amplifier may further include a power control block arranged for controlling the output power of the power amplifier.

The receiver may comprise baseband filters with high linearity due to the application of feedback around the input transistors and due to the special configuration that uses the body effect of the transistors.

Figure 1:
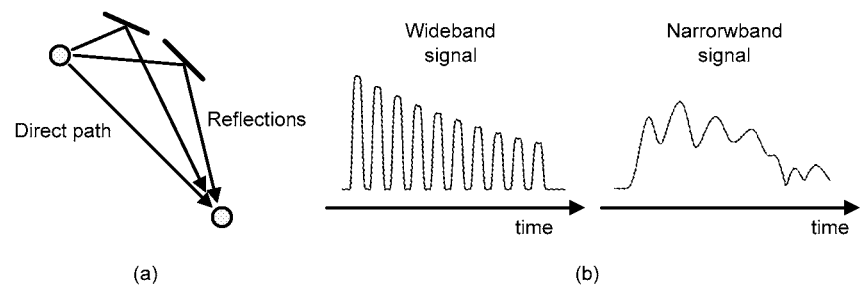
FIG. 1 illustrates (a) transmission over fading multipath channels, (b) received wideband and narrowband signal in dense multipath environments.
Figure 2:
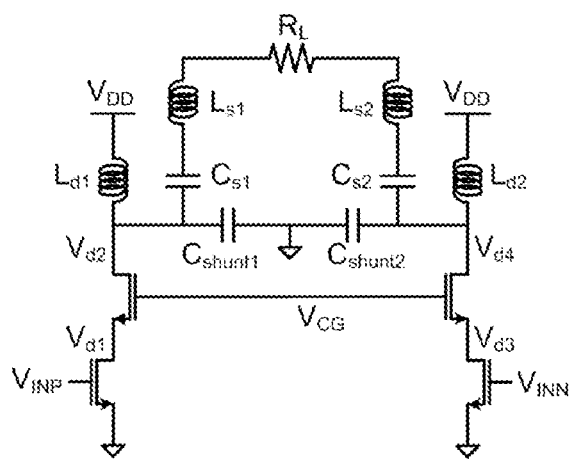
FIG. 2 shows a typical differential cascode Class-E PA.
Figure 3:
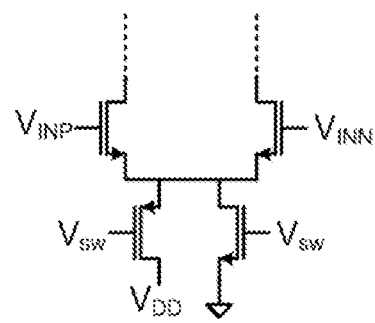
FIG. 3 illustrates a typical common-source switch topology of a power amplifier.
Figure 4:
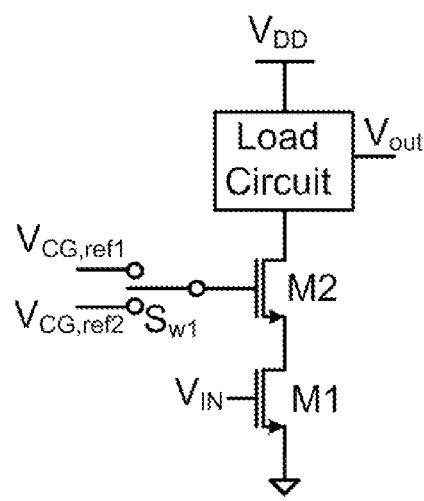
FIG. 4 illustrates an example amplifier circuit, in accordance with an embodiment.

FIG. 4 illustrates an example amplifier circuit, in accordance with an embodiment. As shown, an input $V_{IN}$ is provided for applying an input signal. The input signal is applied to a first transistor M1 via its gate. A second transistor M2 is arranged in cascode with the first transistor M1. The two transistors constitute an amplifier.

A switching means $S_{w1}$ is positioned between the gate of the second transistor M2, and a first and a second port for applying a first and second reference voltage ($V_{CG,ref1}$ and $V_{CG,ref2}$). The two reference voltages are different and are selected such that the amplifier (made up of the first transistor M1 and the second transistor M2) has an amplification factor switchable between a first amplification level and a second amplification level. In this manner, the input signal applied to the amplifier may be modified according to either of the first amplification level and the second amplification level. Accordingly, a modulated (e.g., shaped) version of the input signal may be output at the output $V_{out}$ of the amplifier.

In some embodiments, the power amplifier is a class E power amplifier. These amplifiers may comprise one or more cascode transistors to extend the power supply voltage range. A switching function is placed at the common-gate node of the cascode transistors. Further, the power control block is arranged to control the output power with a dynamic supply voltage and the cascode transistors' gate voltages.

For the sake of simplicity, the following description focuses on embodiments in which the power amplifier is a class E power amplifier. The person of ordinary skill in the art will recognize, however, that the following description is easily applied to other transistors as well.

In a ranging application, it may be desirable for the switch function added to the Class-E power amplifier to perform on/off switching at high speed. For example, in some embodiments the turn-on time of the output signal may be less than 2 ns. Other examples are possible as well.

Figure 5:
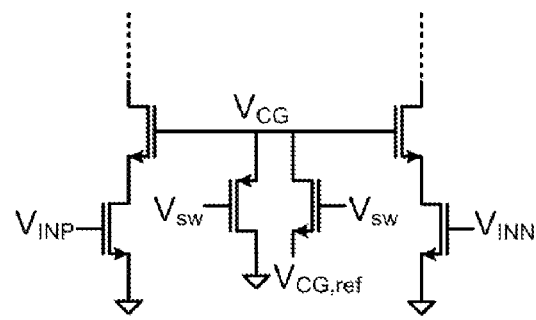
FIG. 5 illustrates an example common-gate switch topology, in accordance with an embodiment.

In this disclosure, such high-speed switching is achieved by a common-gate switch topology that is placed at the common-gate node of the cascode transistors of the class-E power amplifier. FIG. 5 illustrates an example of such a common-gate switch topology, in accordance with an embodiment.

In some embodiments, such as those in which a common-gate switch topology are used (as shown in FIG. 5), the switch may have a width on the order of about 20 μm. For this reason, the common-gate switch topology may offer a higher switching speed with a smaller switch size, increasing efficiency of the power amplifier. In other embodiments, such as those in which a common-source switch topology is used, the switch may have a width of at least 400 μm. Because the common-gate switch is not on the signal path, the efficiency of the power amplifier is not affected by the switch width. This is illustrated in FIG. 6.

Figure 6:
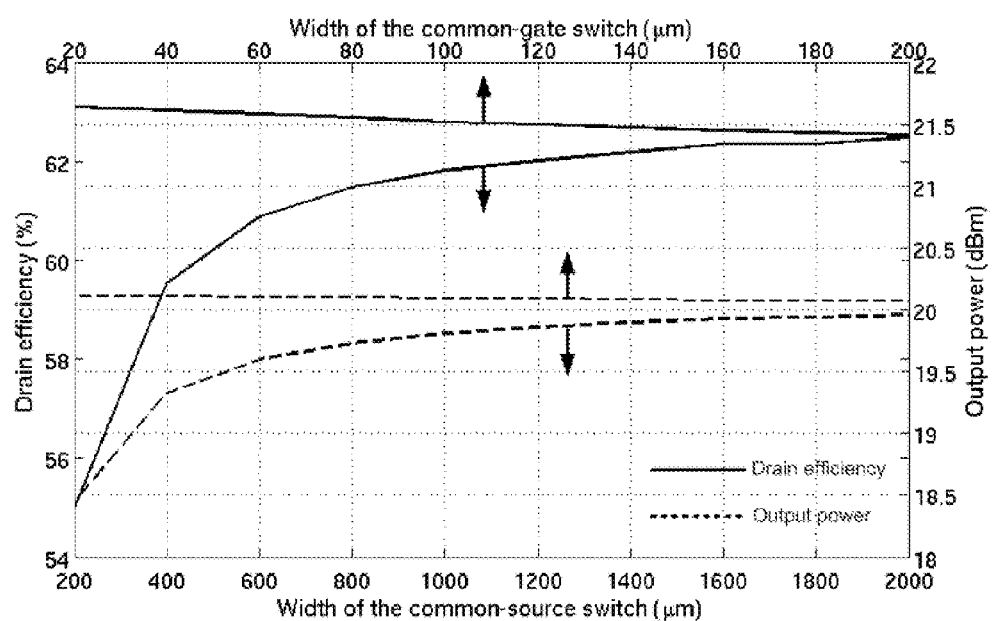
FIG. 6 illustrates output power and drain efficiency as a function of switch width, in accordance with an embodiment.

FIG. 6 illustrates output power and drain efficiency as a function of switch width, in accordance with an embodiment. In particular the output power and drain efficiency for both a common-gate switch topology and a common-source switch topology are shown. It can be seen that the output power and the drain efficiency of the common-gate switch topology are greater than those of the common-source switch topology. This discrepancy increases for smaller-width switches in the common-source switch topology. As shown, the output power and drain efficiency remain almost constant with the change of the switch width for the common-gate switch topology, indicating, as noted above, that the efficiency of the power amplifier is not affected by the switch width in the common-gate switch topology.

Figure 7:
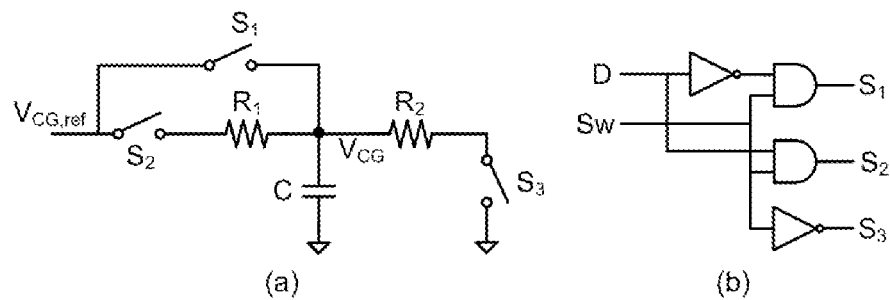
FIG. 7 illustrates (a) an example switch and (b) example control logic, in accordance with an embodiment.

In some embodiments, it may be desirable for the rise/fall time of the switch signal to be tunable. To this end, the circuit may be configured to operate in both fast-switching mode and slow-switching mode. The circuit may further include control logic to tune between the fast-switching and the slow-switching modes. FIG. 7 illustrates (a) an example switch and (b) example control logic, in accordance with an embodiment.

As shown in FIG. 7(a), the example switch may have an effective capacitance C at the common-gate node. Further, the example switch may include a number of resistors, $R_1$ and $R_2$, connected in series. Still further, the example switch may include a number of switches $S_1$, $S_2$ and $S_3$. The resistors $R_1$ and $R_2$ and the switches $S_1$, $S_2$ and $S_3$ may be used to control the rise/fall time of the switch. In some embodiments, each of the switches $S_1$, $S_2$ and $S_3$ may be high logic effective.

As shown in FIG. 7(b), an input D may be used to choose between the fast-switching mode and the slow-switching mode. For example, when D is 1, the circuit may operate in the slow-switching mode, and when D is 0, the circuit may operate in the fast-switching mode. Other examples are possible as well.

Figure 8:
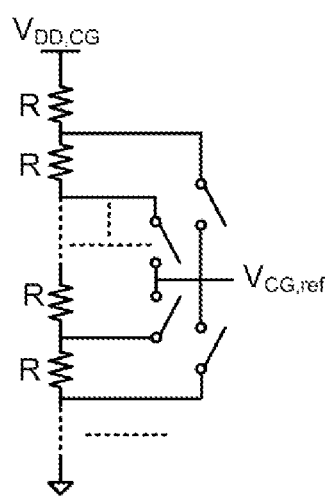
FIG. 8 illustrates an example resistive divider, in accordance with an embodiment.

$S_w$ is the switch signal to switch the power amplifier on and off. $V_{CG,ref}$ is the common gate voltage. The common-gate voltage may be derived from, for example, a resistive divider. FIG. 8 illustrates an example resistive divider, in accordance with an embodiment.

As shown in FIG. 8, the resistive divider includes a switch $V_{CG}$. The output of the switch $V_{CG}$ may be connected to the common-gate node of the power amplifier circuit.

In some embodiments, the disclosed power amplifier circuit may be designed in a Silterra 0.18 μm RF CMOS process for the 2.4 GHz ISM band. The power amplifier of such an embodiment is shown in FIG. 9.

Figure 9:
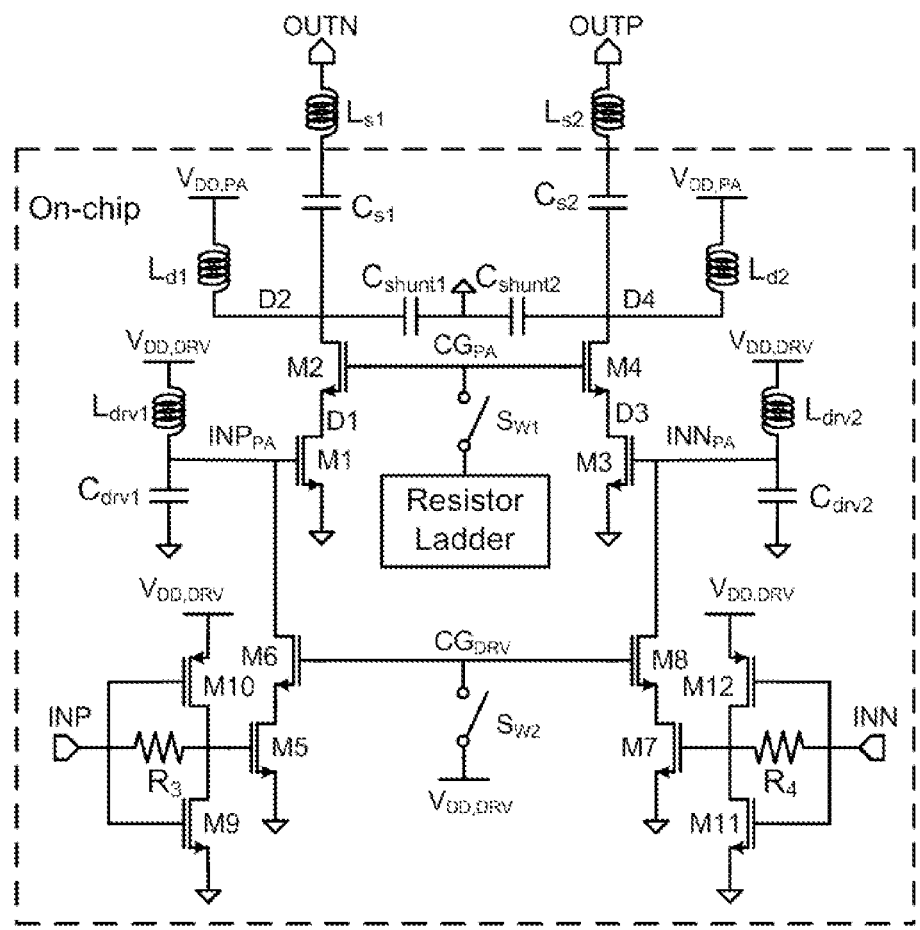
FIG. 9 illustrates an example topology of a differential cascode class-E power amplifier with driver stages, in accordance with an embodiment.

FIG. 9 illustrates an example topology of a differential cascode class-E power amplifier with driver stages, in accordance with an embodiment. As shown in FIG. 9, the example topology includes a first driver stage and a second driver stage. The first drive stage includes two inverters with resistive feedback (M9, M10, M11, M12, $R_3$, $R_4$). The second driver stage includes a differential inductor-capacitor (LC) tank-loaded cascode amplifier (M5, M6, M7, M8, $L_{drv1}$, $L_{drv2}$, $C_{drv1}$, $C_{drv2}$).

The example topology further includes a differential cascode Class-E amplifier (M1, M2, M3, M4, $L_{d1}$, $L_{d2}$, $C_{shunt1}$, $C_{shunt2}$, $L_{s1}$, $L_{s2}$, $C_{s1}$, $C_{s2}$) as the output stage.

The example topology still further includes two switches, $S_{w1}$ and $S_{w2}$ (similar to those described above in connection with FIG. 7(a)) connected to the common-gate nodes of the output stage and the second driver stage to provide the fast switching.

The example topology still further includes a resistive divider (similar to that described above in connection with FIG. 8) connected after $S_{w1}$ and labeled "Resistor Ladder." The resistive divider may provide the dynamic cascode bias voltage. The load resistance $R_L$ is 100 Ohm may be differential.

The example topology still further includes DC-feed inductors $L_{d1}$ and $L_{d2}$. In some embodiments, the inductors $L_{d1}$ and $L_{d2}$ may be implemented with customized on-chip inductors for monolithic integration. When designing the inductors $L_{d1}$ and $L_{d2}$, both the Q factor and the area of the inductors $L_{d1}$ and $L_{d2}$ have to be taken into account. In some embodiments, the optimized differential drain inductance may be about 3.7 nH with a Q factor of 13 at 2.45 GHz. The optimized differential drain inductance and the Q factor may each take other values as well.

The example topology still further includes inductors $L_{s1}$ and $L_{s2}$, which are implemented partly with bondwire inductances and partly with off-chip inductances. In some embodiments, the effective inductance of $L_{s1}$ and $L_{s2}$ may be about 3 nH. The effective inductance may take other values as well.

The transistors of the first and second driver stages may be thin-oxide transistors. In particular, thin-oxide transistors may be used for both the input and cascode transistors of the Class-E stage to minimize the switch-on resistances and the parasitic capacitances. Since in the cascode circuit the main voltage stress is the voltage stress of the cascode transistor, it is always safe to use thin-oxide transistors for the input transistors. However, care should be taken of the voltage limitations of the cascode transistors.

In embodiments where the input of the Class-E stage exhibits a large parasitic capacitance (e.g., greater than 1 pF), it may be desirable to include a driver before the Class-E circuit. Such a driver may be implemented with an LC tank-loaded cascode amplifier to minimize the power consumption of the driver stage. With the cascode topology, higher supply voltages are allowed for larger output voltage swing. The supply voltage of the driver stages may be, for example, about 2.0 V. The supply voltage may take other values as well. Customized on-chip differential inductors are used in this driver stage. The differential inductance may be, for example, about 2.5 nH with a Q factor of 9.5. The differential inductance and the Q factor may take other values as well.

In some embodiments, it may be desirable for the circuit to have a good isolation (that is, good suppression of the output power when the power amplifier is off) to avoid nearby receivers detecting the RF signal before the ranging edge. To this end, a switch may be placed at the common-gate node $CG_{DRV}$ to provide better isolation between the switch-on and switch-off state. The improved isolation results because there is no input signal at the input of the Class-E stage when the driver stage is switched off, meaning the output of the Class-E PA is clean.

The proposed power control method is implemented with the dynamic supply voltage together with the dynamic cascode bias. More specifically, the disclosure adopts dynamic drain supply voltage together with dynamic cascode bias for the power control of the power amplifier, which has a very wide power control range and very high drain efficiency in low output power levels. Because of the finite resistance of the dynamic cascode bias generator, the voltage stress is relieved and the efficiency is enhanced.

Figure 10:
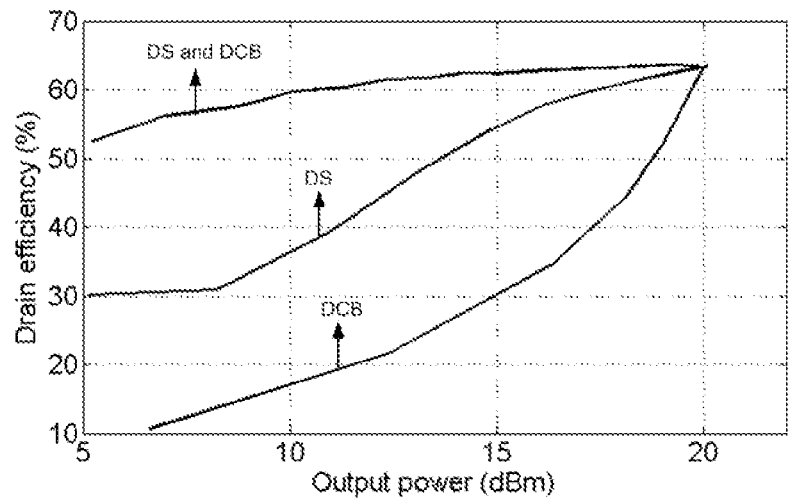
FIG. 10 illustrates drain efficiency as a function of output power with different power control methods.

FIG. 10 illustrates drain efficiency as a function of output power with different power control methods. The power control methods include (i) dynamic supply together with dynamic cascode bias (DS and DCB), (ii) dynamic supply only (DS), and (iii) dynamic cascode bias only (DCB). For the DS method and DCB method, the drain efficiency is optimized for maximum output power.

As shown in FIG. 10, the drain efficiency for the DS and DCB power control method is desirable as compared with the other two power control methods, especially for low output power levels.

The dynamic cascode biases $V_{CG}$ are optimized for each $V_{DD}$ by simulations, and implemented by adjusting the ratio of a resistive divider similar to that shown in FIG. 8. Since the resistive divider has a finite resistance, the voltage at $V_{CG}$ is not fixed but has a ripple feeding through from the drains of the cascode transistors, the frequency of which is twice the working frequency due to the differential topology. The efficiency is enhanced and the voltage stress of the cascode transistors is relieved with the ripple.

Figure 11:
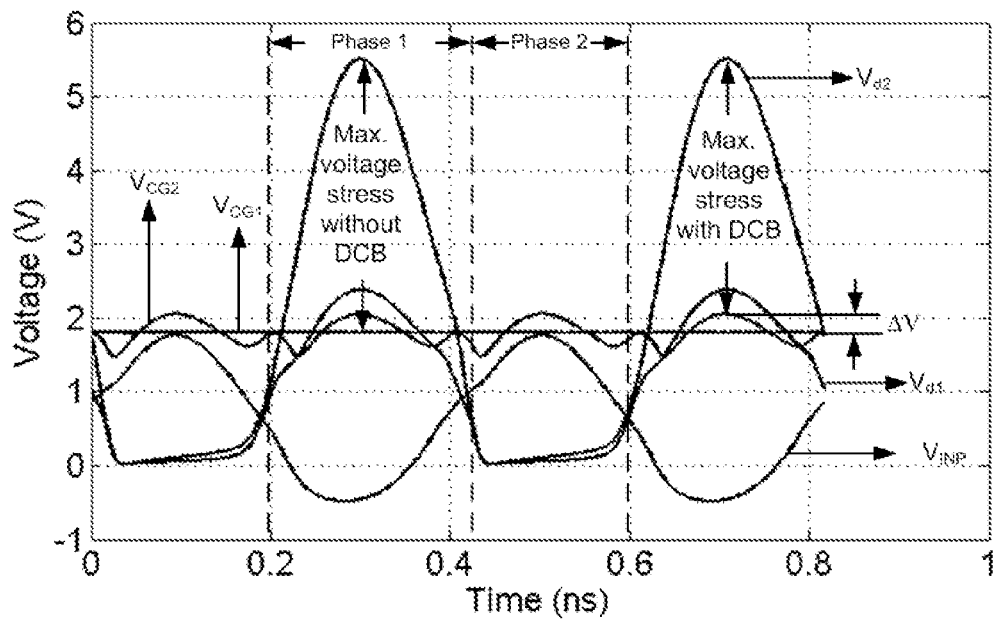
FIG. 11 illustrates waveforms of nodes in the left part of the class-E stage, in accordance with an embodiment.

FIG. 11 illustrates waveforms of nodes in the left part of the class-E stage, in accordance with an embodiment. The waveforms of FIG. 11 are simulated. As shown, $V_{CG1}$ and $V_{CG2}$ represent the waveforms at $V_{CG}$ with a fixed DC voltage and with dynamic cascode bias, respectively.

As shown in FIG. 11, the input and cascode transistors turn off in phase 1 and turn on in phase 2, respectively. $\Delta V$ represents the maximum difference between $V_{CG2}$ and $V_{CG1}$ which is 0.25V both in phase 1 and phase 2. For the cascode topology, the main voltage stress is from the cascode transistor. When the circuit operates in phase 1, $\Delta V$ means that the drain-gate voltage stress of the cascode transistor is relieved by 0.25V with the dynamic cascode bias.

The disclosed amplifier circuit may be used as part of a transmitter in a transceiver device. In the transceiver device, the transmitter and a receiver may operate in half-duplex mode. Typically, a transmit/receive switch is used to connect the transceiver to the antenna and to select the mode of operation, namely, transmission or reception. This transmit/receive switch, however, introduces losses in the signal path, thereby decreasing the transmit power and power efficiency and increasing the receiver noise figure. Further, this transmit/receive switch introduces distortion due to its non-linearity. As a consequence, a transceiver concept without transmit/receive switch is very useful for any wireless system.

The disclosed transmitter may allow for fast enabling of the packet, on account of the fast switching of the transmit power amplifier. Further, the disclosed transmitter may be a low-power transmitter, on account of an innovative power control scheme in the power amplifier (preserving a high efficiency also at low transmit powers), and a transceiver concept without a transmit/receive switch. In some embodiments, the low-power transmitter may also include a favourable circuit topology in the receive baseband filters. Still further, the disclosed transmitter may allow for high bandwidth in the receive path, which requires special care for the linearity and baseband filtering, as using a higher bandwidth reduces the frequency spacing to potential interferers.

In receive mode, the cascode transistor of the power amplifier may be switched off, which allows a transceiver concept without transmit/receive switch towards the antenna, thereby avoiding the issues described above. In some embodiments, the transmit-switch receive may be included, as it is easy to integrate on the chip, but may not be used to handle high power levels.

Figure 12:
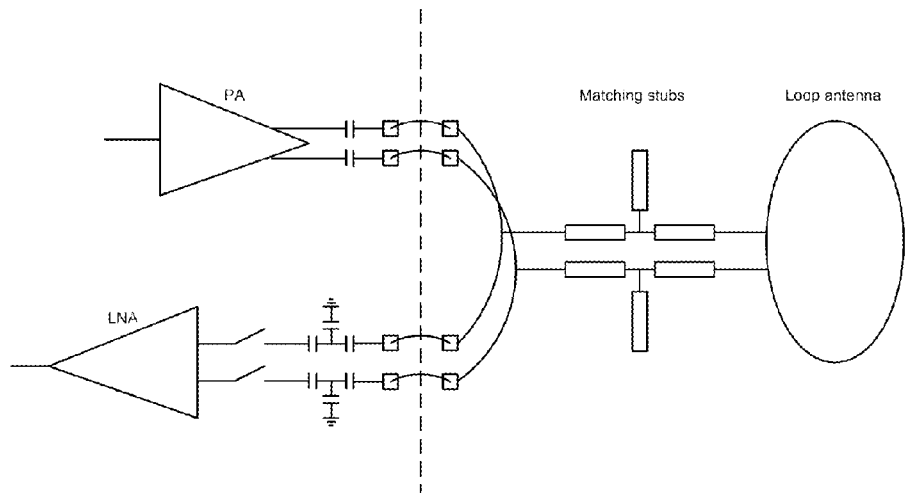
FIG. 12 illustrates an example transceiver without a transmit/receive switch, in accordance with an embodiment.
Figure 13:
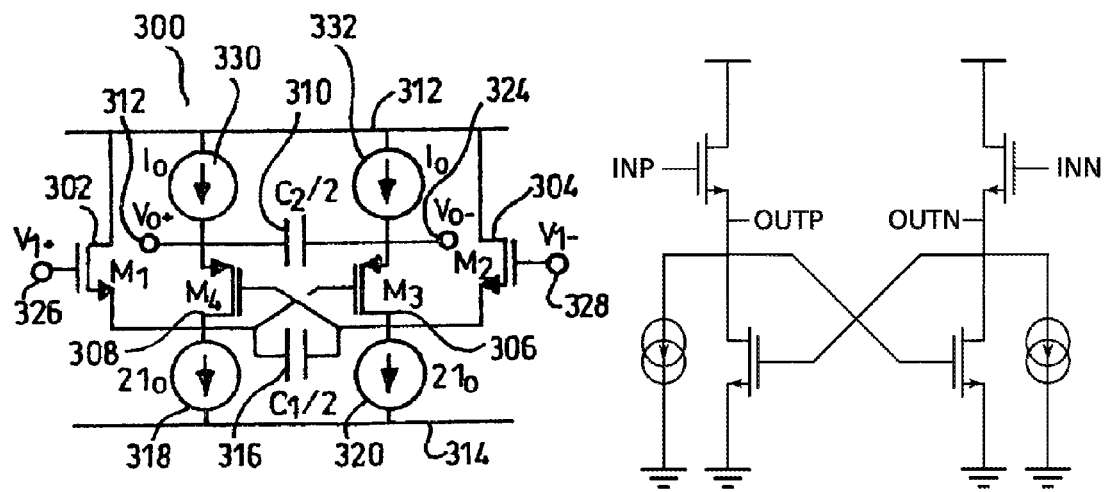
FIG. 13 illustrates (a) an example common-drain based filter circuit and (b) an example differential common-drain filter, in accordance with an embodiment.

FIG. 12 illustrates an example transceiver without a transmit/receive switch, in accordance with an embodiment. As shown, the power amplifier and the low noise amplifier are interconnected towards the same antenna. In receive mode, the power amplifier drain inductor may remain connected to the output pins, helping the matching of the capacitive low noise amplifier.

A further improvement to the receiver design is possible in the filtering section, where a low-power high-linearity filter can be applied.

The receiver may employ a direct conversion architecture. Due to the high bandwidth requirements, it may be desirable for the baseband filters to be steep and highly linear, so as to avoid intermodulation (as the interferers are close to the pass band). For example, in an implementation of a 2.4 GHz ranging transceiver (with tunable RF bandwidth from 250 to 400 MHz), nearby 2.2 GHz Universal Mobile Telecommunications System (UMTS) transmitters pose very high challenges to the integrated active baseband filters. Several low-power topologies are known in the art.

Figure 14:
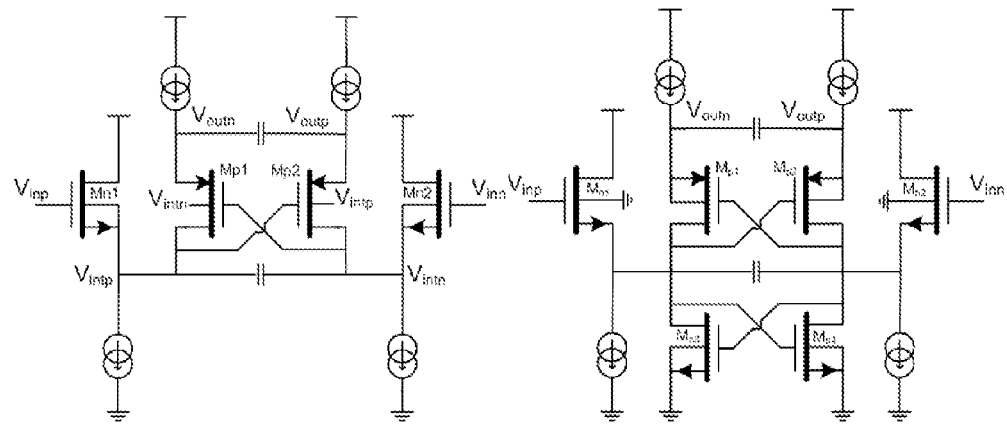
FIG. 14 illustrates (a) integration of a body effect in a filter characteristic and (b) linearization of an input stage.

FIG. 14 illustrates (a) integration of a body effect in a filter characteristic and (b) linearization of an input stage. As shown in FIG. 14(b), through linearization, less current is required in the input source follower, without degrading the noise and linearity of the filter section. Integration of the body effect in the filter characteristic further improves the linearity. Due to the body bias, the saturation voltage of the cross coupled transistors lowers (so that the saturation voltage of the current sources can be higher, which is better for the linearity) and a higher transconductance is obtained in the cross-coupled transistors so that a lower current is needed for the same transconductance. As a consequence, lower power consumption is achieved in a new innovative filter topology.

Figure 15:
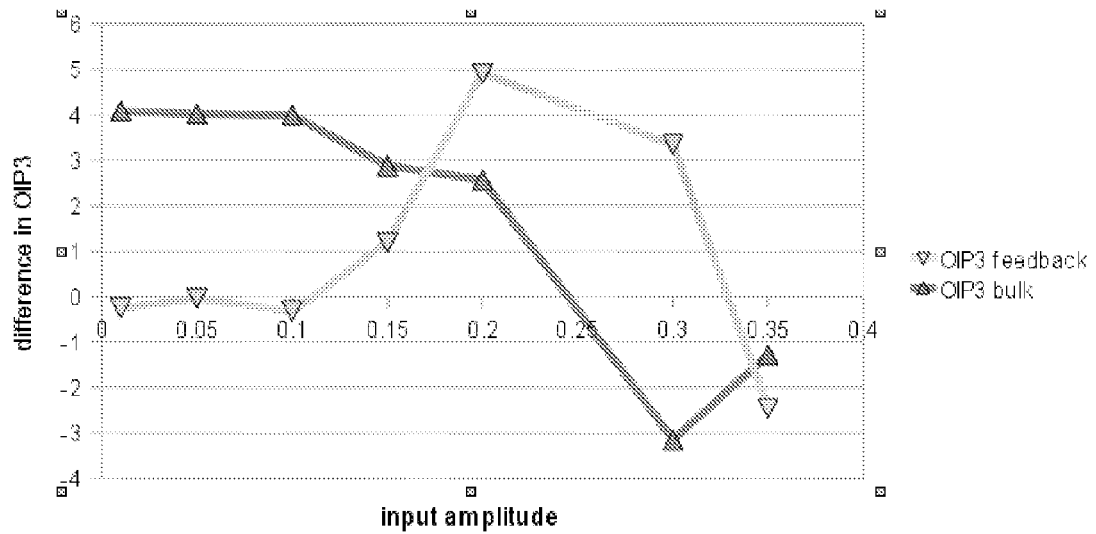
FIG. 15 illustrates the difference in output referred $3^{rd}$ order intercept point between a typical amplifier circuit and the disclosed amplifier circuit, in accordance with an embodiment.

FIG. 15 illustrates the difference in output referred $3^{rd}$ order intercept point (OIP3) between a typical amplifier circuit and the disclosed amplifier circuit, in accordance with an embodiment. It can be seen that the body effect works up to 200 mVpdiff input voltage. If the voltage increases, the non-linearities of the forward biased bulk diode start to dominate. The linearization with feedback around the input source follower works comparably with the original design at low input amplitudes. The feedback starts to work when the input signal is large enough. From this point until the distortion becomes too large, the feedback improves the linearity.

The present disclosure is described with respect to particular embodiments and with reference to certain drawings but the disclosure is not limited thereto. The drawings described are only schematic and are non-limiting. In the drawings, the size of some of the elements may be exaggerated and not drawn on scale for illustrative purposes.

Furthermore, the terms first, second, third and the like in the description and in the claims, are used for distinguishing between similar elements and not necessarily for describing a sequential or chronological order. The terms are interchangeable under appropriate circumstances and the embodiments of the disclosure can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the disclosure described herein can operate in other orientations than described or illustrated herein.

The term "comprising", used in the claims, should not be interpreted as being restricted to the means listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting of only components A and B. It means that with respect to the present disclosure, the only relevant components of the device are A and B.

What is claimed is:

1. An amplifier circuit comprising:
    an input configured to receive an input signal;
    an amplifier connected to the input and configured to receive the input signal and generate a modulated input signal based on the input signal and one of a first amplification level and a second amplification level, wherein the amplifier comprises:
        a first transistor configured to receive the input signal, wherein the first transistor comprises a first gate, and
        a second transistor connected in cascode with the first transistor, wherein the second transistor comprises a second gate; and
    a switching component configured to switch the amplifier between the first amplification level and the second amplification level, wherein the switching component is switchably connected between (i) the second gate and (ii) a first port configured to receive a first reference voltage and a second port configured to receive a second reference voltage different than the first reference voltage; and
    an output connected to the amplifier and configured to output the modulated input signal.

2. The amplifier circuit of claim 1, wherein the amplifier being connected to the input comprises the first gate being connected to the input.

3. The amplifier circuit of claim 1, wherein the amplifier comprises a Class-E amplifier.

4. The amplifier circuit of claim 1, wherein the switching component has a common-node switching topology.

5. The amplifier circuit of claim 1, further comprising control logic configured to tune the switching component between a fast-switching mode and a slow-switching mode.

6. The amplifier circuit of claim 1, wherein:
    the amplifier is further configured to receive a supply voltage; and
    at least one of the first reference voltage and the second reference voltage is based on the supply voltage.

7. The amplifier circuit of claim 1, further comprising a resistive divider configured to generate at least one of the first reference voltage and the second reference voltage.

8. The amplifier circuit of claim 1, further comprising a driver circuit configured to drive the amplifier.

9. A differential amplifier circuit comprising:
    a first driver stage comprising:
        a first inverter,
        a second inverter, and
        a resistive feedback;
    a second driver stage connected to the first driver stage, the second driver stage comprising:
        a first differential amplifier;
    an output stage connected to the second driver stage, the second driver stage comprising:
        a second differential amplifier;
    a first switch connected to the output stage;
    a second switch connected to the second driver stage; and
    a resistive divider connected to the first switch.

10. The differential amplifier circuit of claim 9, wherein:
    the first inverter comprises a first transistor and a second transistor connected in cascode with the first transistor; and
    the second inverter comprises a third transistor and a fourth transistor connected in cascode with the third transistor.

11. The differential amplifier circuit of claim 10, wherein at least one of the first, second, third, and fourth transistors comprises a thin-oxide transistor.

12. The differential amplifier circuit of claim 9, wherein the first differential amplifier comprises a differential LC tank-loaded cascode amplifier.

13. The differential amplifier circuit of claim 9, wherein the second differential amplifier comprises a differential cascode Class-E amplifier.

14. The differential amplifier circuit of claim 9, further comprising a third switch connected to the second driver stage.

15. A transceiver comprising:
    a transmitter comprising an amplifier circuit, the amplifier circuit comprising:
        an input configured to receive an input signal;
        an amplifier connected to the input and configured to receive the input signal and generate a modulated input signal based on the input signal and one of a first amplification level and a second amplification level, wherein the amplifier comprises:
            a first transistor configured to receive the input signal, wherein the first transistor comprises a first gate, and
            a second transistor connected in cascode with the first transistor, wherein the second transistor comprises a second gate; and
        a switching component configured to switch the amplifier between the first amplification level and the second amplification level, wherein the switching component is switchably connected between (i) the second gate and (ii) a first port configured to receive a first reference voltage and a second port configured to receive a second reference voltage different than the first reference voltage; and
        an output connected to the amplifier and configured to output the modulated input signal.

16. The transceiver of claim 15, further comprising a receiver.

17. The transceiver of claim 16, further comprising a matching component to match an impedance of the transmitter with an impedance of the receiver.

18. The transceiver of claim 16, wherein the receiver comprises a baseband-filtering component.

19. The transceiver of claim 18, wherein the baseband-filtering component comprises a common-drain filter comprising a pair of cross-coupled transistors.

20. The transceiver of claim 15, wherein amplifier comprises a Class-E amplifier.

\* \* \* \* \*